(12) United States Patent
Sepkhanov et al.

(10) Patent No.: US 9,872,381 B2
(45) Date of Patent: Jan. 16, 2018

(54) CIRCUIT BOARD COMPRISING AT LEAST ONE FOLD

(71) Applicant: PHILIPS LIGHTING HOLDING B.V., Eindhoven (NL)

(72) Inventors: Ruslan Akhmedovich Sepkhanov, Eindhoven (NL); Siebe Tjerk De Zwart, Valkenswaard (NL); Johannes Wilhelmus Weekamp, Beek en Donk (NL); Johannes Alexander Rebergen, Eindhoven (NL); Arnold Buijs, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 142 days.

(21) Appl. No.: 14/888,789

(22) PCT Filed: Apr. 30, 2014

(86) PCT No.: PCT/EP2014/058844
§ 371 (c)(1),
(2) Date: Nov. 3, 2015

(87) PCT Pub. No.: WO2014/177625
PCT Pub. Date: Nov. 6, 2014

(65) Prior Publication Data
US 2016/0088721 A1    Mar. 24, 2016

(30) Foreign Application Priority Data
May 3, 2013    (EP) ..................... 13166495

(51) Int. Cl.
*F21V 7/00* (2006.01)
*H05K 1/02* (2006.01)
*F21V 7/04* (2006.01)
*F21V 7/18* (2006.01)
*F21K 9/60* (2016.01)
*H05K 1/05* (2006.01)
*F21S 8/02* (2006.01)
*F21Y 115/10* (2016.01)
*F21Y 107/40* (2016.01)

(52) U.S. Cl.
CPC ............... *H05K 1/028* (2013.01); *F21K 9/60* (2016.08); *F21V 7/0058* (2013.01); *F21V 7/048* (2013.01);
(Continued)

(58) Field of Classification Search
CPC .... H05K 1/028; H05K 1/0278; H05K 1/0277; H05K 1/0284; F21V 7/0058; F21V 7/048; F21V 7/18; F21V 19/045; F21K 9/60
See application file for complete search history.

(56) References Cited

U.S. PATENT DOCUMENTS 5,519,596 A * 5/1996 Woolverton .......... F21S 48/215
                                          257/E25.028
2007/0001177 A1* 1/2007 Bruning .................... F21K 9/00
                                          257/79
(Continued)

FOREIGN PATENT DOCUMENTS

DE    102007046639 A1    4/2009
JP         0636620 A      2/1994
(Continued)

Primary Examiner — Alexander Garlen (57) ABSTRACT

A circuit board (10) for carrying at least one light source (16) of a lighting device and a method of manufacturing such a circuit board are provided. The circuit board comprises a substrate (1), wherein the substrate comprises at least one fold (9) forming a projecting portion and extending from a periphery (3) of the substrate up to an inner portion (2) of the substrate, whereby the substrate has a polygonal funnel shape. The present aspects use the concept of folding the substrate in order to obtain a polygonal funnel shape of the circuit board, whereby shaping of the substrate without requiring removal of material of the substrate is allowed.

17 Claims, 5 Drawing Sheets

(52) U.S. Cl.
CPC ............ F21V 7/18 (2013.01); H05K 1/0277 (2013.01); F21S 8/02 (2013.01); F21Y 2107/40 (2016.08); F21Y 2115/10 (2016.08); H05K 1/056 (2013.01); H05K 2201/055 (2013.01); H05K 2201/10106 (2013.01); H05K 2203/302 (2013.01)

(56) References Cited

U.S. PATENT DOCUMENTS

| | | | |
|---|---|---|---|
| 2008/0271913 A1 | 11/2008 | Enomoto et al. | |
| 2009/0009977 A1* | 1/2009 | Enomoto | H05K 1/189 361/749 |
| 2011/0109217 A1* | 5/2011 | Kang | F21V 29/004 313/46 |
| 2011/0222286 A1* | 9/2011 | Oba | G01N 21/8806 362/249.04 |
| 2012/0063133 A1 | 3/2012 | Takeuchi et al. | |
| 2012/0281411 A1* | 11/2012 | Kajiya | H05K 1/028 362/249.02 |
| 2012/0314369 A1 | 12/2012 | Wu | |

FOREIGN PATENT DOCUMENTS

| | | |
|---|---|---|
| JP | 2011040510 A | 2/2011 |
| JP | 2011249536 A | 12/2011 |
| JP | 2012094305 A | 10/2012 |
| WO | 2011012963 A2 | 2/2011 |
| WO | 2011080125 A1 | 7/2011 |

* cited by examiner

CIRCUIT BOARD COMPRISING AT LEAST ONE FOLD

CROSS-REFERENCE TO PRIOR APPLICATIONS

This application is the U.S. National Phase application under 35 U.S.C. §371 of International Application No. PCT/EP2014/058844, filed on Apr. 30, 2014, which claims the benefit of European Patent Application No. 13166495.5, filed on May 3, 2013. These applications are hereby incorporated by reference herein.

FIELD OF THE INVENTION

The present invention generally relates to the field of circuit boards for carrying at least one light source of a lighting device.

BACKGROUND OF THE INVENTION

Conventional solid state based lighting devices normally comprise light sources coupled to a circuit board, a supporting structure for supporting and orienting the circuit board and the light sources as desired, a reflector for reflecting light emitted by the light sources and a heat sink for dissipating heat generated by the light sources. It may be advantageous to integrate two or more of the components of the lighting device into a single component, thereby reducing the number of components in the lighting device, which facilitates manufacturing and reduces costs. JP2011040510 shows a lighting device with a circuit board to which light emitting diodes (LEDs) are mounted. The circuit board comprises a reflective surface and has a rectangular shape, wherein two opposite long sides of the circuit board are bent so as to reflect light emitted by the LEDs. Further, the circuit board comprises metal for conducting heat generated by the LEDs. A drawback with the circuit board shown in JP2011040510 is that the configuration with the bent portions of the circuit board merely enables a linear shape (or trench-like shape) of the circuit board.

SUMMARY OF THE INVENTION

It would be advantageous to achieve a circuit board overcoming, or at least alleviating, the above mentioned drawback. In particular, it would be desirable to enable other shapes of a circuit board for carrying at least one light source of a lighting device.

To better address one or more of these concerns, a circuit board and a method of manufacturing a circuit board having the features defined in the independent claims are provided. Preferable embodiments are defined in the dependent claims.

Hence, according to a first aspect, a circuit board for carrying at least one light source of a lighting device is provided. The circuit board comprises a substrate, wherein the substrate comprises at least one fold forming a projecting portion and extending from a periphery of the substrate up to an inner portion of the substrate, whereby the substrate has a polygonal funnel shape.

According to a second aspect, a method of manufacturing a circuit board for carrying at least one light source of a lighting device is provided. The method comprises providing a substrate and folding the substrate so as to form at least one fold forming a projecting portion and extending from a periphery of the substrate up to an inner portion of the substrate, whereby the substrate obtains a polygonal funnel shape.

A polygonal funnel shape (or in general a bowl- or funnel-like shape) of a substrate of a circuit board may be desirable for different reasons. For example, it may be desired to have a polygonal funnel shaped supporting structure for the light source (or light sources) and/or a polygonal funnel shaped reflecting surface at the circuit board for reflecting light from the light source. The present aspects use the concept of folding the substrate in order to obtain a polygonal funnel shape of the circuit board. The extension of the fold (which also may referred to as a pleat) from the periphery of the substrate up to (but not past) the inner portion of the substrate may turn an originally substantially planar shape of a substrate into a polygonal funnel shape. The present aspects allow shaping of the substrate without requiring removal of material of the substrate. Hence, the polygonal funnel shape of the substrate may be obtained by the fold instead of cutting away a piece of the substrate and joining of the edges of the cut out of the substrate. Thus, material loss may be reduced.

In the present specification, the term "polygonal funnel shape" is to be widely interpreted and may include any polygonal funnel shape, such as any (at least partially) parabolic, funnel, cup, pyramid or cone shape, and also polygonal variations of these shapes. Further, the inner portion of the substrate may be any portion of the substrate separate from the periphery of the substrate. Preferably, the fold may reach from a portion of the periphery of the substrate up to the inner portion of the substrate, but not past the inner portion up to an opposite portion of the periphery of the substrate.

The fold may project from the non-folded portions of the substrate, such as from the outside of the polygonal funnel shape, which may facilitate heat dissipation from the substrate. The projecting portion formed by the fold may e.g. act like a heat dissipating fin.

According to an embodiment, the fold comprises at least one folding line and two portions of the substrate located on opposite sides of the folding line. Thus, the folding line may extend from the periphery of the substrate up to the inner portion of the substrate. For example, the two portions of the substrate may be interconnected at the folding line. The folding line may form an (outer) edge (or ridge) of the fold. Further, the angle between the two portions of the substrate (on opposite sides of the folding line) may be comprised within an interval of 0 to 90°, preferably within an interval of 0 to 45°, and most preferably within an interval of 0 to 10°. The smaller the angle is between the two portions of the substrate, the deeper (or more distinct) is the polygonal funnel shape of the substrate. In an embodiment, the two portions may at least partially abut each other, whereby the angle between the two portions may be, at least at the abutment of the two portions, around 0.

According to an embodiment, the fold comprises at least two folding lines extending from separate points of the periphery of the substrate towards a common point. Hence, the fold may be formed by the substrate being folded along at least two folding lines extending towards the same point. It will be appreciated that the common point may be an imaginary point, and thus not necessarily a point of the substrate, which e.g. may be the case if a piece of the substrate is removed (or not present) at the location of the common point. Further, the previously described two portions of the substrate may be located on opposite sides of one of the folding lines, and the other one of the folding lines may delimit one of the two portions from an adjacent non-folded portion of the substrate. If the fold comprises no more than two folding lines, the transition between the other one of the two portions of the substrate (not delimited by both, but merely by one of the folding lines) and an adjacent non-folded portion of the substrate may not comprise any folding line. Hence, the substrate may be straight (or planar), at the interface (or limit) between the fold and the portion of the substrate adjacent to the fold. Optionally, the fold may comprise a further folding line (i.e. three folding lines in total extending from separate points of the periphery of the substrate towards a common point), which may delimit the other one of the two portions from an adjacent non-folded portion of the substrate. Alternatively, the fold may comprise no more than one folding line, and the interface between the fold and the portions of the substrate adjacent to the fold may be curved instead of comprising a folding line.

In an embodiment, the depth of the fold increases in direction from the inner portion of the substrate towards the periphery of the substrate. In the present specification, the depth of the fold is the distance from the edge (or ridge) of the fold (e.g. the outermost folding line) to a non-folded portion of the substrate adjacent to the fold. The increased depth of the fold in direction towards the periphery of the substrate contributes to obtain the polygonal funnel shape of the substrate. Further, the width of the fold may increase in direction from the inner portion of the substrate towards the periphery of the substrate. In this context, the width of the fold is the distance between the two portions of the substrate located on opposite sides of the folding line, where the fold interfaces the adjacent non-folded portions of the substrate.

According to an embodiment, the substrate has a polygonal shape, and the at least one fold may extend from a corner of the polygonal shape and up to the inner portion of the substrate. Hence, the substrate may have polygonal periphery (or circumference).

According to an embodiment, the at least one fold projects inwards in the polygonal funnel shape. Alternatively, the at least one fold may project outwards such as from the outside of the polygonal funnel shape. In case two or more folds are provided, both inwards and/or outwards projected portions may be provided.

According to an embodiment, the fold is arranged to dissipate heat generated by the at least one light source, which increases the life-time of the light source. The fold may e.g. act as a fin for heat dissipation from the substrate and form (at least a part of) a heat sink of the lighting device. Thus, the heat sink and the circuit board may be integrated in the same component, thereby reducing the number of components of the lighting device, which facilitates manufacturing. In an embodiment, the substrate may comprise a material having a thermal conductivity of at least 1 W/(mK), such as metal, which enhances heat dissipation from the light source. The substrate may comprise any material with relatively high heat conductivity, such as any metal (e.g. aluminum or copper) or thermally conductive polymer. Using a material with a lower thermal conductivity may be compensated by having a larger thickness of the substrate. However, a smaller thickness of the substrate facilitates forming of the fold.

According to an embodiment, the circuit board further comprises a reflective surface arranged at the substrate so as to reflect light emitted by the at least one light source, whereby the circuit board may act as a reflector of the lighting device. Thus, the reflector and circuit board may be integrated in the same component, thereby reducing the number of components of the lighting device, which facilitates manufacturing. The reflective surface may e.g. be diffuse, specular or a combination thereof (that is, partially diffuse and partially specular). The circuit board may have a reflective layer applied on the substrate providing the reflective surface. In an embodiment, the circuit board may further comprise a reflective solder resist arranged so as to reflect light emitted by the at least one light source. The solder resist may provide the reflective surface of the circuit board. Alternatively, or as a complement, the substrate may be made of a material with light reflecting properties, such as metal, whereby (at least a portion of) the reflective surface may be provided by the substrate itself. Hence, at least a portion of the substrate may act as a reflector of the lighting device.

According to an embodiment, the circuit board further comprises a spring extending at least partially around the circumference of the polygonal funnel shape of the substrate so as to support the substrate in the funnel shape. The spring may e.g. comprise an at least slightly resilient ring, such as a metal ring, holding the substrate in the folded position. Hence, the spring may extend around the outside of the polygonal funnel shape and maintain the substrate in the folded position. The spring may not necessarily extend around the entire circumference of the substrate, but preferably at least around a major portion of the circumference of the substrate. The present embodiment is advantageous in that the substrate is secured in the funnel shaped position reducing the risk of the substrate getting unfolded during packaging and transportation.

According to an embodiment, a lighting device is provided. The lighting device comprises a circuit board as defined in any one of the preceding embodiments and at least one light source coupled to the circuit board. Thus, a lighting device with a polygonal funnel shaped circuit board is provided.

According to an embodiment, the lighting device further comprises a driver configured to drive the at least one light source, the driver being coupled to the circuit board. Thus, the circuit board may be used for carrying the driver of the lighting device. Further, the driver and the at least one light source may be arranged on opposite sides of the circuit board. For example, the at least one light source may be arranged on a reflective side of the circuit board and the driver on a side of the circuit board opposite to the reflective side. Alternatively, the driver may not be coupled (i.e. external) to the circuit board.

It is noted that the invention relates to all possible combinations of features recited in the claims. Further, it will be appreciated that the various embodiments described for the circuit board are all combinable with the method as defined in accordance with the second aspect of the present invention.

Further objectives of, features of, and advantages with, the present aspects will become apparent when studying the following detailed disclosure, the drawings and the appended claims. Those skilled in the art realize that different features of the present invention can be combined to create embodiments other than those described in the following.

BRIEF DESCRIPTION OF THE DRAWINGS

These and other aspects will now be described in more detail, with reference to the appended drawings showing embodiments.

All the figures are schematic, not necessarily to scale, and generally only show parts which are necessary in order to elucidate the invention, wherein other parts may be omitted or merely suggested.

DETAILED DESCRIPTION

A circuit board for a lighting device and a method of manufacturing such circuit board according to embodiments will be described with reference to FIGS. 1 to 5.

Figure 1:
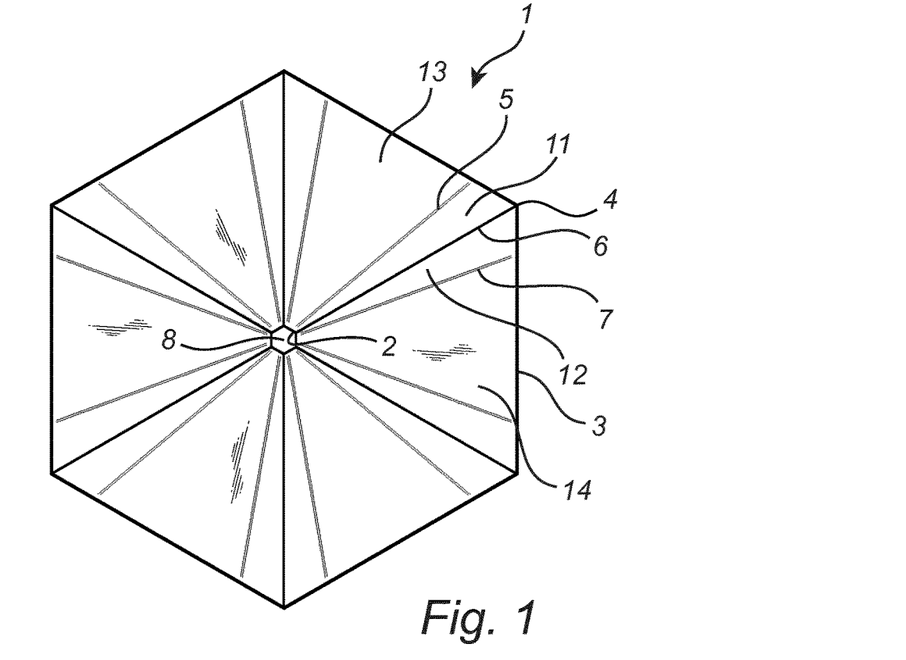
FIG. 1 shows a substrate of a circuit board during a manufacturing stage according to an embodiment.
Figure 2:
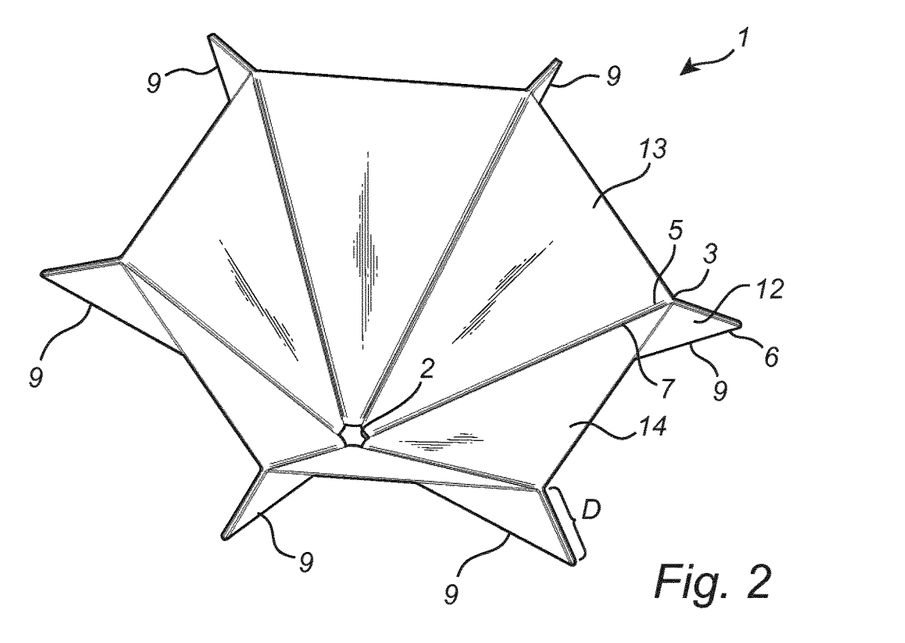
FIG. 2 shows the substrate of the circuit board during another manufacturing stage according to an embodiment.

The method of manufacturing the circuit board comprises providing a substrate 1, as illustrated in FIG. 1. The substrate 1 may at a manufacturing stage be substantially planar. The substrate 1 may comprise metal (such as aluminum or copper) or any material with relatively high thermal conductivity, such as thermally conductive polymer. For example, the substrate 1 may comprise a metal sheet. The substrate 1 may have any desired shape, such as a polygonal shape having multiple corners 4. The method further comprises folding the substrate 1 so as to form one or more folds 9 (in the present example, six folds 9) extending from a periphery 3 of the substrate 1 up to an inner portion 2 of the substrate, as illustrated in FIGS. 1 and 2. FIG. 1 shows the substrate 1 being unfolded but with folding lines 5, 6, 7 of the folds 9 illustrated and FIG. 2 shows the substrate 1 when the folds 9 have been formed. Optionally, a mid portion of the substrate 1 may be removed (such as cut out) prior to the folding so as to facilitate forming the folds 9 of the substrate 1. The cut out may be used for electronic connections (such as wires) of the circuit board.

Each fold 9 may comprise one or more folding lines, such as a first folding line 5, a second folding line 6 and a third folding line 7, extending from the periphery 3 of the substrate 1 towards a common point 8. Optionally, the folding lines 5, 6, 7 may not extend all the way up to the common point 8, but up to the inner portion 2 of the substrate 1. The inner portion 2 of the substrate 1 may be any portion of the substrate 1 separate from the (outer) periphery 3 of the substrate 1, such as a portion of the substrate 1 located substantially at (or proximate to) the center of the substrate 1. Further, the common point 8 may be an imaginary point and may not necessarily be located at the substrate 1. For example, the common point 8 may be located at the center of the circuit board, such as where the mid portion of the substrate 1 is cut out, as illustrated in FIG. 1. Each fold 9 may comprise a first portion 11 and a second portion 12 of the substrate 1 arranged on opposite sides of the second folding line 6. Further, the first portion 1 may be delimited from a non-folded portion 13 of the substrate 1 by the first folding line 5 and the second portion 12 of the substrate 1 may be delimited from another non-folded portion 14 of the substrate 1 by the third folding line 7. The fold 9 may be formed by the first and second portions 11, 12 of the substrate 1 being brought towards each other. In the present example, the first and second portions 11, 12 of the substrate 1 at least partially abut (thereby at least partially overlapping) each other, whereby an angle between the first and second portions 11, 12 is around 0. In other embodiments, the first and second portions 11, 12, may form an angle comprised within an interval of 0 to 90°, preferably within an interval of 0 to 45°, and most preferably within an interval of 0 to 10°.

Figure 3:
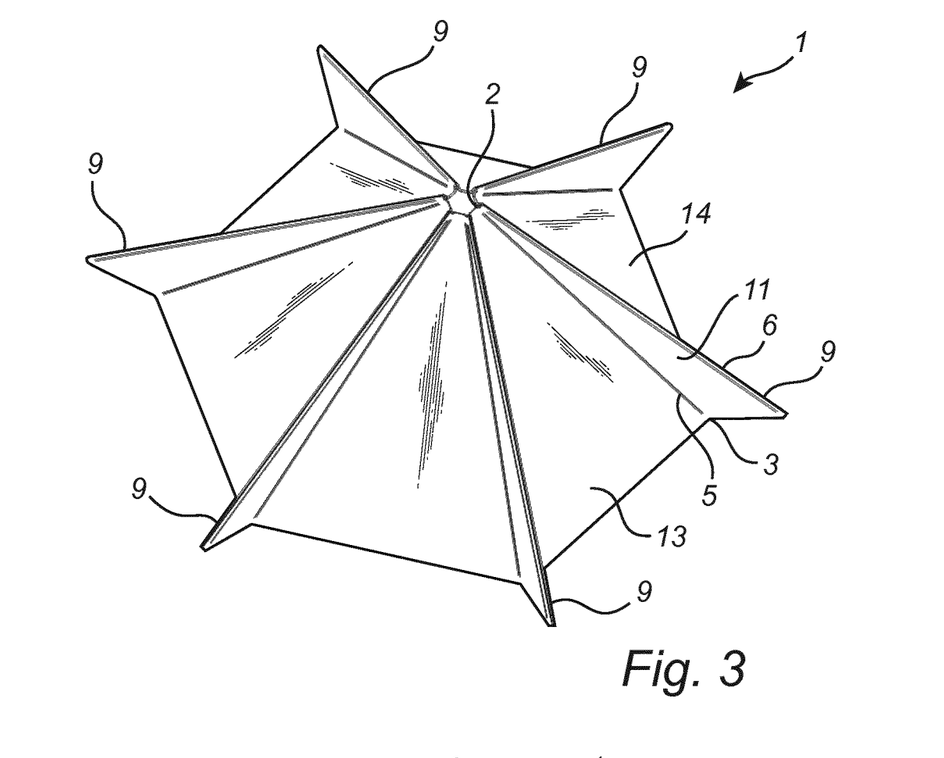
FIG. 3 shows another view of the substrate shown in FIG. 2.
Figure 4:
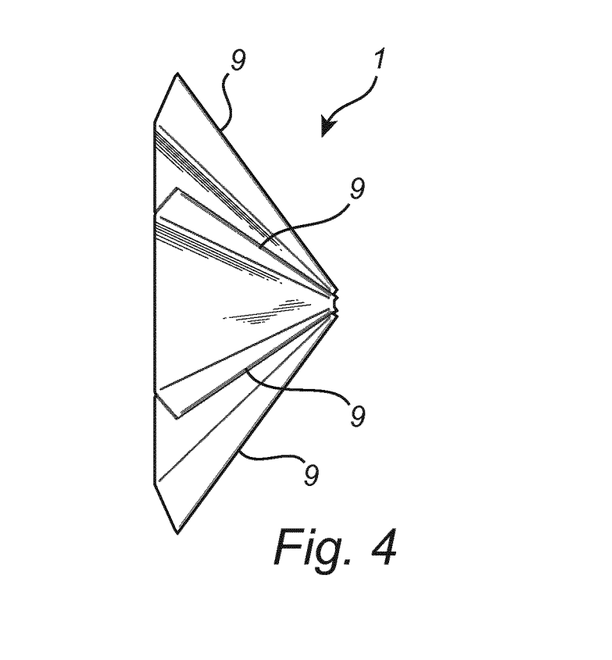
FIG. 4 shows yet another view the substrate shown in FIG. 2.

As a consequence of the substrate 1 being folded as described above, it obtains a polygonal funnel shape (or in general a funnel shape). The funnel shape gets wider (is flared) in direction from the inner portion 2 of the substrate 1 towards the periphery 3 of the substrate 1. The funnel shape of the substrate 1 may e.g. be an at least partially conical shape. In the present example, the substrate 1 has been folded so as to obtain a polygonal funnel shape. The depth D of the folds 9 may increase in direction from the inner portion 2 of the substrate 1 towards the periphery 3 of the substrate 1, which contributes to a deeper (or more distinct) funnel shape. The folds 9 may project from the non-folded portions 13, 14 of the substrate 1, such as from the outside of the polygonal funnel shape (as illustrated in FIGS. 2 to 4) and/or inwards in the polygonal funnel shape (not shown), so as to form projecting portions of the substrate. Alternatively, one or more of the folds 9 may be arranged so as to abut one of the non-folded portions 13, 14 of the substrate 1.

Figure 5:
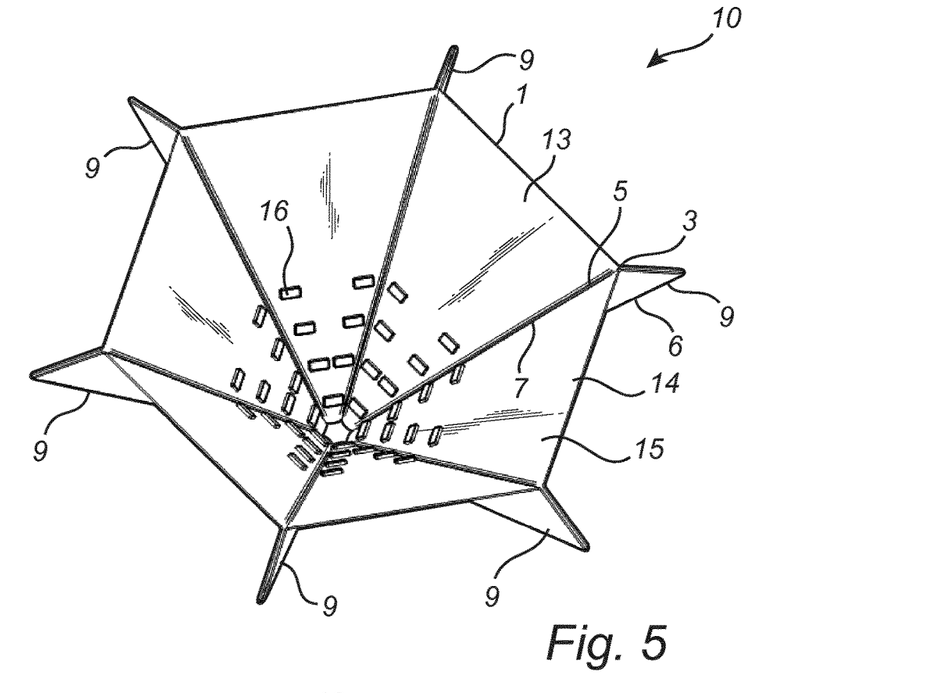
FIG. 5 shows the circuit board comprising the substrate according to an embodiment.

Further, one or more light sources 16, such as solid state based light sources (e.g. light emitting diodes, LEDs), may be coupled (such as soldered or glued) to the substrate 1, as illustrated in FIG. 5 showing the circuit board 10. In case the substrate 1 is made of metal, the circuit board 10 may comprise a dielectric layer 15 for electric insulation between the components carried by the circuit board 10 and the substrate 1. The circuit board 10 may further comprise metal (e.g. copper) tracks (not shown) for electrically interconnecting the components of the circuit board 10. A solder resist (or solder mask) may be applied to the substrate 1. The solder resist may preferably be reflective for reflecting light emitted by the light sources 16. Hence, the solder resist may provide a reflective surface of the circuit board 10 for reflecting light emitted by the light sources. The metal surface of the substrate 1 and/or the dielectric layer 15 may also provide reflective surfaces for reflecting light emitted by the light sources 16. The circuit board 10 may e.g. be a printed circuit board, PCB, optionally with a metal core (i.e. with a substrate made of metal).

According to an example (not shown), merely a portion of the substrate may be covered with the dielectric layer, while another portion of the substrate is uncovered (or exposed). In the present example, a portion of the reflective surface of the circuit board may be provided by the solder resist at the dielectric layer (or any reflective surface of the dielectric layer), and another portion of the reflective surface may be provided by the uncovered portion of the substrate. Reflecting properties of the substrate may be provided by the substrate being of metal and/or a reflective coating applied on the substrate.

Figure 6:
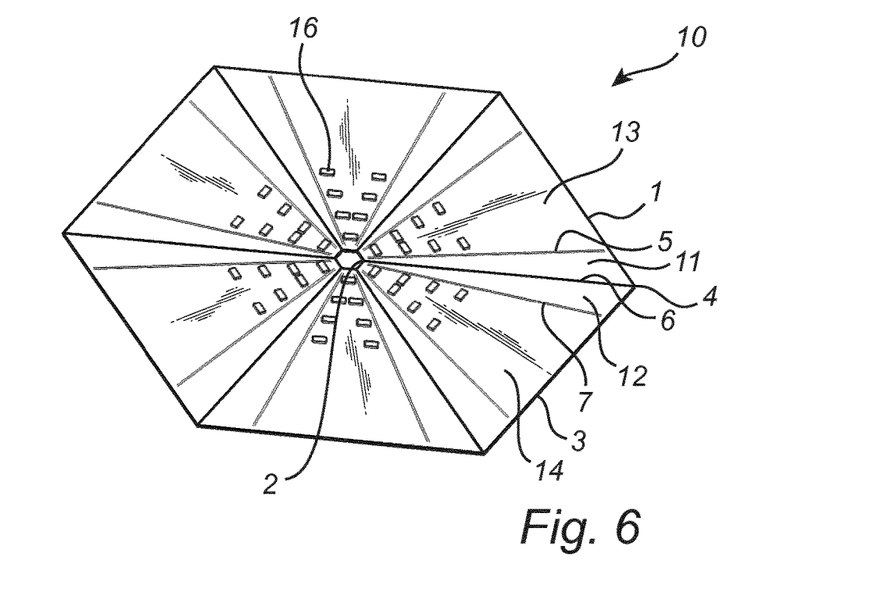
FIG. 6 shows a circuit board during a manufacturing stage according to an embodiment.

The light sources 16 may be mounted to the substrate 1 after the substrate 1 has been folded. Alternatively, the light sources 16 may be mounted prior to folding the substrate 1, as illustrated in FIG. 6. Further, a driver configured to drive the light sources 16 may be mounted to the circuit board 10 (not shown), either on the same side of the substrate 1 as the light sources 16 or on the side of the substrate 1 opposite to the side at which the light sources 16 are mounted.

Figure 7:
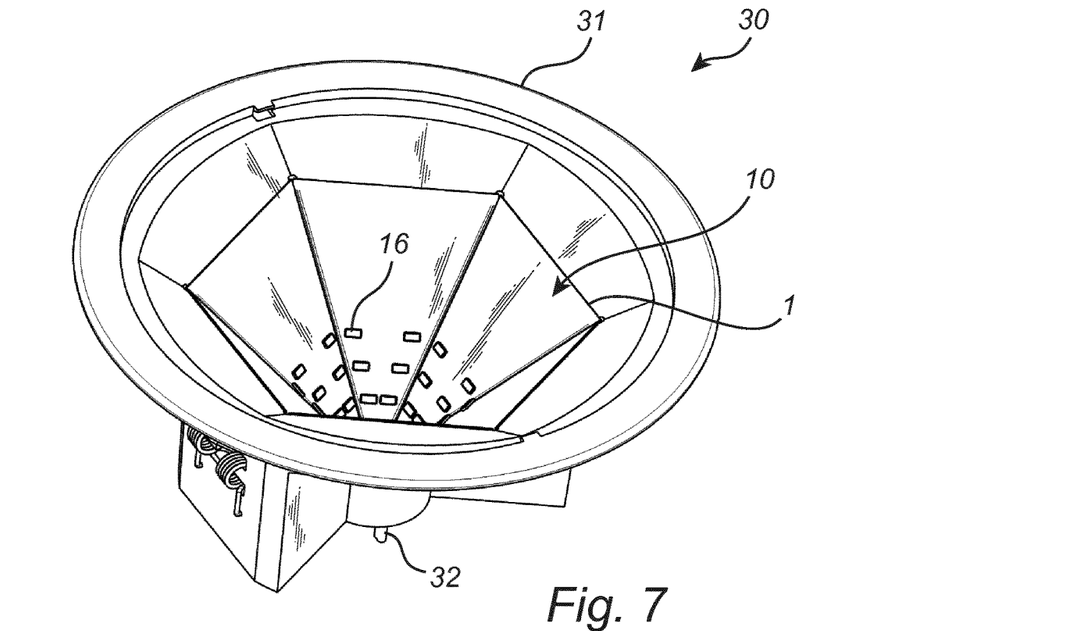
FIG. 7 shows a lighting device according to an embodiment.
Figure 8:
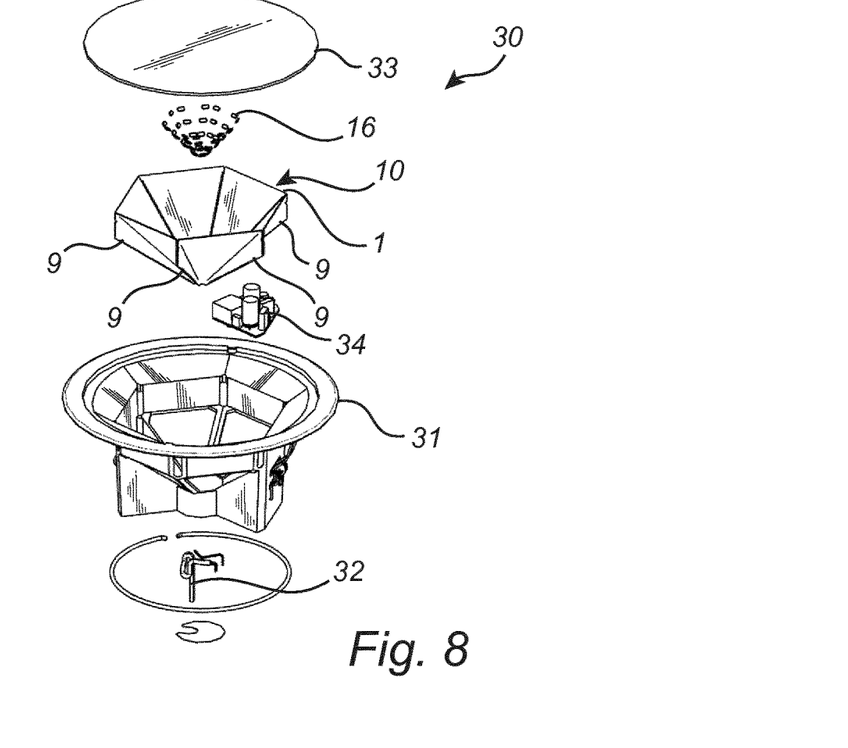
FIG. 8 is an exploded view of the lighting device shown in FIG. 7.

The circuit board 10 carrying the light sources 16 may be mounted in a lighting device 30, as illustrated in FIG. 7 showing a perspective view of the lighting device 30 and FIG. 8 showing an exploded view of the lighting device 30. The lighting device 30 may comprise a housing (or frame) 31, in which the circuit board 10 may be supported, a driver 34 coupled to the circuit board 10, such as on the side of the circuit board 10 opposite to the side to which the light sources 16 are coupled. The lighting device 30 may further comprise contact pins 32 for connecting the lighting device 30 to a power supply and a transparent (or translucent) cover 33 (e.g. made of glass) for protecting the light sources 16. Optionally, the cover may comprise an optical element, such as a diffusing element.

The circuit board 10 may act as a funnel shaped reflector of the lighting device 30 and a, preferably rigid, funnel shaped support structure for the light sources 16. A drawback with the circuit board shown in JP2011040510 is that the bent portions of the circuit board merely enable reflection of light emitted from the LEDs in directions towards the long sides of the circuit board, while light emitted in directions towards the short sides of the circuit board is not reflected. With the present embodiment, the circuit board 10 provides reflection of light emitted by the light sources 16 in more directions.

Further, the circuit board 10 may act as a heat sink for the components carried by the circuit board 10, such as the light sources 16. The heat conductive material (e.g. metal) of the circuit board 10 dissipates heat generated by the light sources 16. Moreover, the folds 9 may act as heat dissipating fins further enhancing heat dissipation from the light sources 16. Since the polygonal funnel shape of the circuit board is obtained by the folds 9, material spillage is reduced in manufacturing of the circuit board 10. The excessive material (i.e. the folds 9) resulting from forming the polygonal funnel shape of the originally planar substrate may, instead of being cut away, be used as heat dissipating fins. A hexagonal shape of the substrate is advantageous in that material spillage is further reduced since the hexagonal shape allows cutting several hexagonal substrates out of a single (metal) sheet (at least almost) without wasting material.

Figure 9:
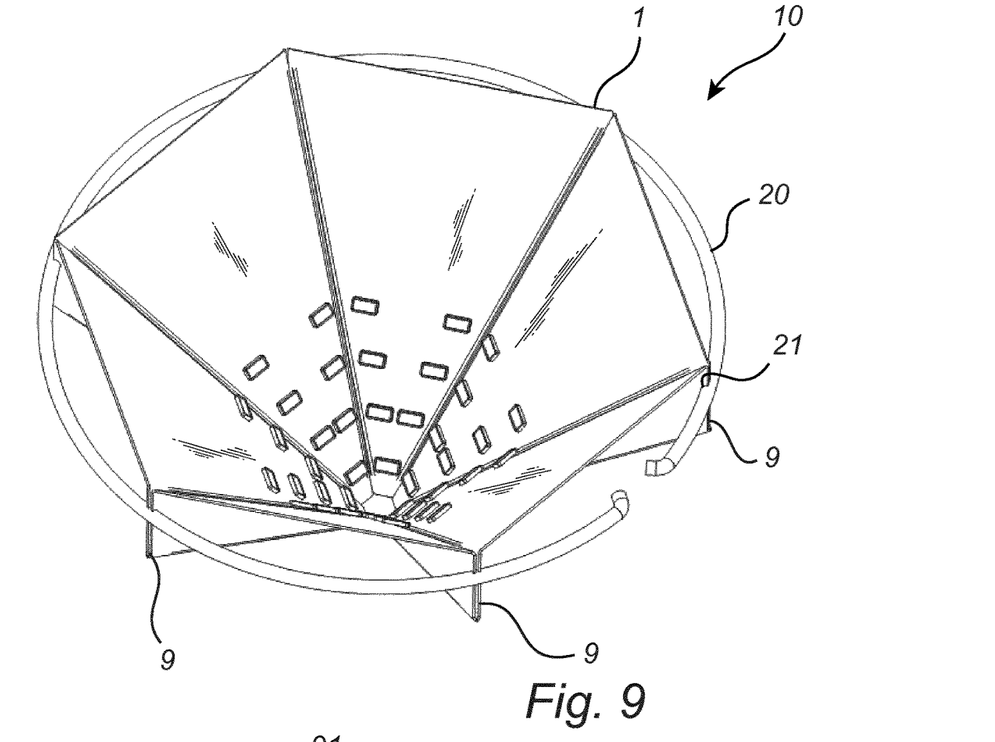
FIG. 9 shows a circuit board according to another embodiment.

According to an embodiment illustrated in FIG. 9, the circuit board 10 may further comprise a spring 20 extending around the circumference of the funnel-like shape of the substrate so as to support the substrate in the funnel-like shape. The spring 20 may e.g. comprise a slightly resilient ring-like element, such as a metal ring holding the substrate in the folded position. Hence, the spring 20 may extend around the outside of the funnel shape and maintain the substrate 1 in the folded position. The spring 20 may be supported by grooves 21 in the folds 9.

Figures 10, 11:
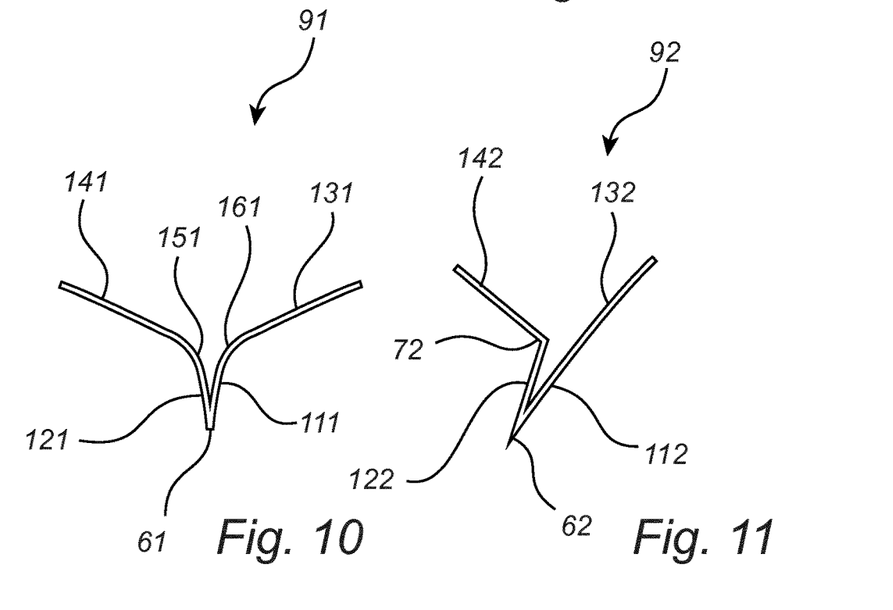
FIG. 10 shows a fold of a circuit board according to an embodiment.
FIG. 11 shows a fold of a circuit board according to another embodiment.

According to embodiments, the fold may comprise no more than one folding line (as illustrated in FIG. 10) or no more than two folding lines (as illustrated in FIG. 11). FIG. 10 is a cross-section of a fold 91 having one folding line 61 separating the first and second portions 111, 121 of the substrate. The fold 91 is delimited from the adjacent non-folded portions 141, 131 of the substrate by curved portions 151, 161 of the substrate. FIG. 11 is a cross-section of a fold 92 having a first folding line 61 separating the first and second portions 111, 121 of the substrate and a second folding line 72 separating the second portion 122 of the substrate from the adjacent non-folded portion 142 of the substrate. The transition between the first portion of the substrate 112 and the adjacent non-folded portion 132 of the substrate may be straight or curved (or at least not defined by a folding line).

For the sake of clarity, only one of multiples of a certain feature (such as the light sources, the corners of the polygonal shape of the substrate and the first, second and third folding lines) is denoted with a reference sign in the drawings (with the folds, which are all denoted with reference number 9, as an exception).

While embodiments have been illustrated and described in detail in the drawings and foregoing description, such illustration and description are to be considered illustrative or exemplary and not restrictive; the invention is not limited to the disclosed embodiments.

For example, each fold may comprise more than three folding lines. Further, the folds may project from different sides of the substrate. The circuit board may have more than six or less than six folds. The at least one light source and/or the driver may be mounted on either side of the funnel-like substrate.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A circuit board for carrying at least one light source of a lighting device, the circuit board comprising:
    a substrate having a polygonal funnel shape and at least one fold extending from a periphery of the substrate up to an inner portion of the substrate toward a center point, said at least one fold formed by folded portions of said substrate, and said polygonal funnel shape formed by said folded portions of said substrate, said substrate having an originally polygonal planar shape having at least three straight sides and said center point, wherein a depth of said at least one fold increases in direction from said inner portion of said substrate towards said periphery of said substrate.

2. The circuit board as defined in claim 1, wherein the at least one fold comprises at least one folding line and two portions of the substrate located on opposite sides of the folding line.

3. The circuit board as defined in claim 2, wherein an angle between said two portions of the substrate is comprised within an interval of 0 to 90°.

4. The circuit board as defined in claim 2, wherein said two portions at least partially abut each other.

5. The circuit board as defined in claim 1, wherein the at least one fold comprises at least two folding lines extending from separate points of the periphery of the substrate towards a common point.

6. The circuit board as defined in claim 1,
    wherein the at least one fold extends from a corner of the polygonal funnel shape and up to said inner portion of the substrate.

7. The circuit board as defined in claim 1, wherein the at least one fold projects inwards in the polygonal funnel shape.

8. The circuit board as defined in claim 1, wherein the at least one fold is arranged to dissipate heat generated by the at least one light source.

9. The circuit board as defined in claim 1, wherein the substrate comprises a material having a thermal conductivity of at least 1 W/(mK), such as metal.

10. The circuit board as defined in claim 1, further comprising a reflective surface arranged at the substrate so as to reflect light emitted by the at least one light source.

11. The circuit board as defined in claim 1, further comprising a reflective solder resist arranged so as to reflect light emitted by the at least one light source.

12. The circuit board as defined in claim 1, further comprising a spring extending at least partially around a circumference of the polygonal funnel shape of the substrate so as to support the substrate in the polygonal funnel shape.

13. A lighting device comprising:
    a circuit board as defined in claim 1; and
    at least one light source coupled to the circuit board.

14. A method of manufacturing a circuit board for carrying at least one light source of a lighting device, the method comprising:
    providing a substrate having a polygonal planar shape having at least three straight sides and a center point; and
    folding the substrate so as to form at least one fold forming a projecting portion and extending from a periphery of the substrate up to an inner portion of the substrate toward said center point, wherein a depth of said at least one fold increases in direction from said inner portion of said substrate towards said periphery of said substrate, whereby the substrate obtains a polygonal funnel shape.

15. The circuit board as defined in claim 1, wherein the at least one fold forms discontinuities within the substrate.

16. The method of manufacturing a circuit board as defined in claim 14, further comprising removing a portion of the substrate around said center point before folding the substrate to facilitate forming said at least one fold.

17. The method of manufacturing a circuit board as defined in claim 14, wherein said polygonal funnel shape comprises an open top and an open bottom.

\* \* \* \* \*